(12) United States Patent
Vogt

(10) Patent No.: US 7,205,243 B2
(45) Date of Patent: Apr. 17, 2007

(54) PROCESS FOR PRODUCING A MASK ON A SUBSTRATE

(75) Inventor: Mirko Vogt, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/173,171

(22) Filed: Jul. 1, 2005

(65) Prior Publication Data
US 2006/0003590 A1    Jan. 5, 2006

(30) Foreign Application Priority Data
Jul. 2, 2004    (DE)    ........... 10 2004 032 677

(51) Int. Cl.
*H01L 21/302* (2006.01)
(52) U.S. Cl. ............ 438/715; 438/706; 438/710; 216/41
(58) Field of Classification Search .......... 438/706, 438/710, 712, 714, 720, 723, 725, 717; 216/67, 216/41, 46; 430/312
See application file for complete search history.

(56) References Cited

U.S. PATENT DOCUMENTS

| | | | |
|---|---|---|---|
| 4,599,137 A | 7/1986 | Akiya | |
| 5,403,438 A | 4/1995 | Motoyama | |
| 5,814,238 A * | 9/1998 | Ashby et al. | 216/62 |
| 5,814,563 A * | 9/1998 | Ding et al. | 438/714 |
| 6,413,851 B1 | 7/2002 | Chow et al. | |
| 6,451,673 B1 * | 9/2002 | Okada et al. | 438/513 |
| 6,501,185 B1 | 12/2002 | Chow et al. | |
| 6,573,030 B1 | 6/2003 | Fairbairn et al. | |
| 6,632,741 B1 * | 10/2003 | Clevenger et al. | 438/689 |
| 6,713,396 B2 | 3/2004 | Anthony | |
| 2004/0018738 A1 | 1/2004 | Liu | |

FOREIGN PATENT DOCUMENTS

EP    1 267 398 A2    12/2002
EP    1 359 613 A2    11/2003

OTHER PUBLICATIONS

Liu W., et al., "Generating Sub-30nm Poly-Silicon Gates Using PECVD Amorphous Carbon as Hardmask and Anti-Reflective Coating," Proceedings of SPIE, 2003; vol. 5040(1), pp. 841-848.

* cited by examiner

*Primary Examiner*—Lan Vinh
(74) *Attorney, Agent, or Firm*—Slater & Matsil, L.L.P.

(57) ABSTRACT

To produce a mask, a first mask layer (40) is applied to the substrate (10). During or after the deposition of the first mask layer (40), the latter is exposed to an etching step. The etching step is carried out in such a manner that the material of the first mask layer (40) that has been deposited on side flanks (30) of the raised structure (20) is completely removed from the side flanks (30) or is at least in sections completely removed from the side flanks (30). A second mask layer (50) is applied to the first mask layer and to the uncovered side flank sections (150) of the raised structure (20). Then, the first and second mask layers can be patterned so as to complete the mask (60).

20 Claims, 4 Drawing Sheets

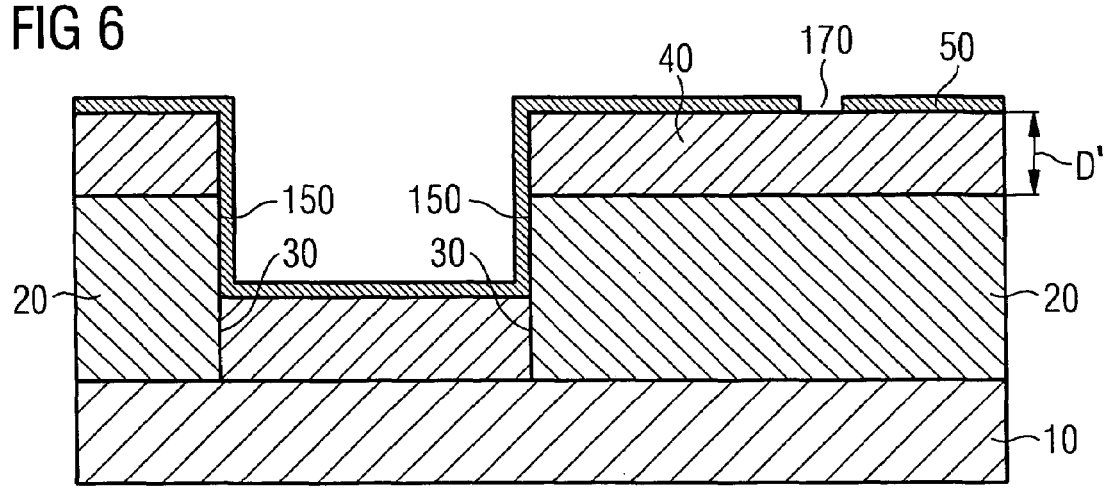
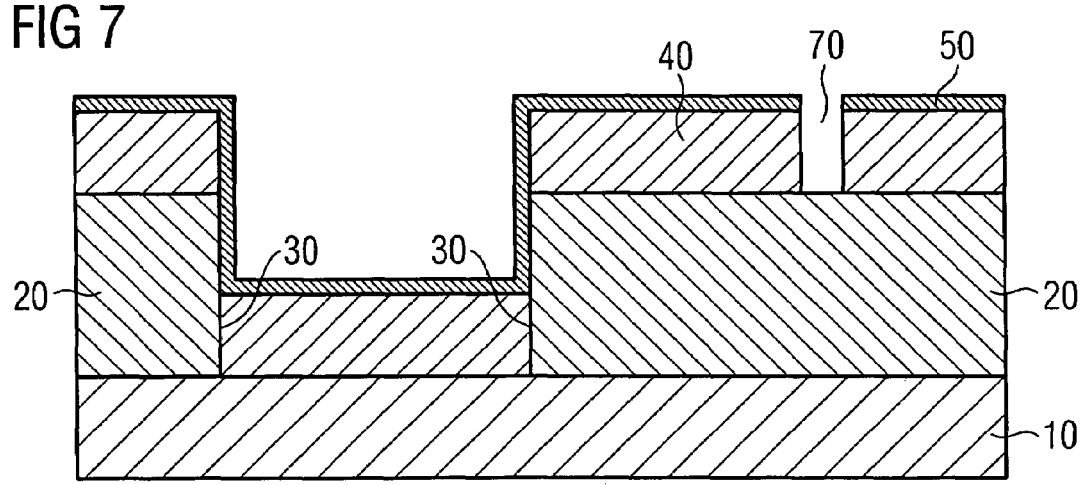
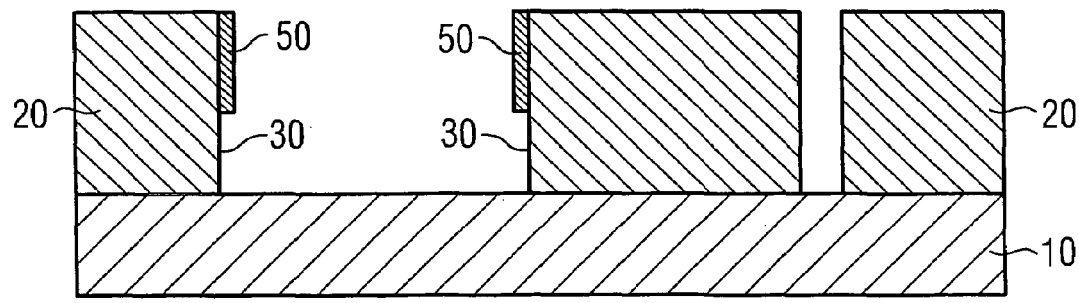

PROCESS FOR PRODUCING A MASK ON A SUBSTRATE

This application claims priority to German Patent Application 10 2004 032 677.0, which was filed Jul. 2, 2004, and is incorporated herein by reference.

TECHNICAL FIELD

The invention relates to a process for producing a mask, in particular an etching mask, on a substrate. Processes of this type are used, for example, in the fabrication of electronic integrated circuits.

BACKGROUND

U.S. Pat. No. 6,573,030, which is incorporated herein by reference, has disclosed a process in which a mask comprising two mask layers is applied to a substrate. The first mask layer is a carbon-containing layer that is formed as part of a deposition process using a gas containing carbon and hydrogen. A second mask layer, which may consist, for example, of an oxide, a nitride, a silicon oxynitride, a silicon carbide, amorphous silicon or other materials, is applied to this carbon-containing mask layer. The two mask layers are patterned using a photoresist mask, so as to form the finished, patterned mask. The finished mask can be used, for example, to etch substrate structures, i.e., structures in or on the substrate.

The document "Generating Sub-30 nm Poly-Silicon Gates Using PECVD Amorphous Carbon as Hardmask and Anti-Reflective Coating" (Wei Liu Mui, Thorsten Lill, May Wang, Chris Bencher, Michael Kwan and Wendy Yeh; Proceedings SPIE, 2003; 5040(1): 841-8.), incorporated herein by reference, has likewise disclosed a process in which a carbon-containing mask layer is patterned as a mask and then used further. It is stated in this document that the feature size of the structures of the carbon-containing mask layer can subsequently be reduced by an additional "trimming" step until predetermined desired dimensions are reached.

SUMMARY OF THE INVENTION

In one aspect, the invention provides a method for producing a mask that can be carried out particularly easily and reliably for substrates with at least one raised structure. The mask produced should in particular be simple to process further.

Embodiments of the invention provide a method for producing a mask on a substrate that has at least one raised structure. A first mask layer is formed over the substrate. During or after the formation of the first mask layer, the first mask layer is exposed to an etching step, which is carried out in such a manner that the material of the first mask layer, which has been deposited on side flanks of the raised structure, is completely removed from the side flanks. A second mask layer is formed over the first mask layer and to the uncovered side flank sections of the raised structure. The first and second mask layers are then patterned so as to complete the mask.

One significant advantage of the method according to embodiments of the invention is that the second mask layer rests directly on the side flanks in the region of the side flanks of the raised structure, and is, therefore, not separated from the side flanks by the layer material of the first mask layer. The fact that the second mask layer is in direct contact with the side flanks ensures that the two mask layers of the mask can be reliably processed independently of one another, for example removed. In particular, the second mask layer is prevented from flaking off in the side flank regions of the raised structures during the detachment of the first mask layer. This effect is achieved specifically because the second mask layer rests directly on the raised structure in the region of the side flanks and, therefore, cannot be lifted off, as it were, during detachment of the first mask layer. On account of the second mask layer resting directly on the side flanks of the raised structure, the second mask layer instead continues to adhere to the side flank region of the raised structure even when the first mask layer is being detached, so that uncontrolled detachment or flaking off of the second mask layer is avoided.

The direct adhesion of the second mask layer to the side flanks of the raised structures, which has been described is advantageous in particular if the second mask layer—after the mask has been "used"—is to be removed again by an etching process with a very selective etching action, since in such a case mask material of the second mask layer may under certain circumstances remain behind without being etched in the region of the side flanks. The direct application of the second mask layer to the side flanks of the raised structures in accordance with the invention always ensures that no mask material is lifted off the second mask even if the first mask layer is removed, for example by etching; therefore, the mask material of the second mask layer remains in place on the side flanks of the raised structures.

The first mask layer is preferably a carbon-containing layer. The advantages of carbon-containing mask layers are described, for example, in the documents mentioned in the introduction.

The second mask layer may consist, for example, of $SiO_x$ or SiON material.

The etching step for removing the carbon-containing layer from the side flanks of the raised structure is preferably carried out using an $H_2$-containing plasma, an $O_2$-containing plasma or an $N_2O$-containing plasma.

To prevent the first mask layer from "losing" too much material outside the side flanks during the etching step for uncovering the side flanks, the etching step is preferably carried out as an anisotropic etching step, in which the etching rate in the direction parallel to the substrate surface of the substrate is greater than perpendicular to the substrate surface. This ensures that the etching rate in the direction of the side flanks of the raised structure is considerably greater than perpendicular to the substrate. This prevents or at least significantly reduces thinning of the first mask layer outside the side flank region.

The following etching parameters are examples of parameters that are particularly suitable for uncovering the side flanks of the raised structure if the first mask layer used is a carbon-containing layer:

a) $H_2$ plasma example:
  gas flow rate: 100 to 10 000 sccm, preferably approx. 1600 sccm of hydrogen,
  pressure: 2 to 8 Torr, preferably approx. 4 Torr,
  power: 100 to 3000 watts, preferably approx. 2500 W,
  electrode spacing: 250 to 600 mils, preferably 500 miles.

b) $NH_3$ plasma example:
  gas flow rate: 100 to 10 000 sccm of $NH_3$, preferably approx. 630 sccm of $NH_3$, and 0 to 20 000 sccm of $N_2$, preferably approx. 18 000 sccm of $N_2$,
  pressure: 2 to 8 Torr, preferably approx. 4 Torr,
  power: 100 to 2000 watts, preferably approx. 500 W,
  electrode spacing: 250 to 600 mils, preferably 500 miles.

c) O$_2$ plasma example:
gas flow rate: 100 to 10 000 sccm of O$_2$, preferably approx. 8000 sccm of O$_2$,
pressure: 2 to 8 Torr, preferably approx. 4 Torr,
power: 100 to 3000 watts, preferably approx. 1000 W,
electrode spacing: 250 to 600 mils, preferably 600 mils.
d) N$_2$O plasma example:
gas flow rate: 100 to 10 000 sccm of N$_2$O, preferably approx. 9000 sccm of N$_2$O,
pressure: 2 to 8 Torr, preferably approx. 2.7 Torr,
power: 50 to 3000 watts, preferably approx. 100 W,
electrode spacing: 250 to 600 mils, preferably 400 mils.

BRIEF DESCRIPTION OF THE DRAWINGS

For a more complete understanding of the present invention, and the advantages thereof, reference is now made to the following descriptions taken in conjunction with the accompanying drawing, in which:

FIGS. 4 to 8 show an exemplary embodiment of the execution of the process according to the invention with an etching step for uncovering the side flanks of the raised structures.

In the figures, the same reference numerals are used for identical or similar components.

Figure 1:
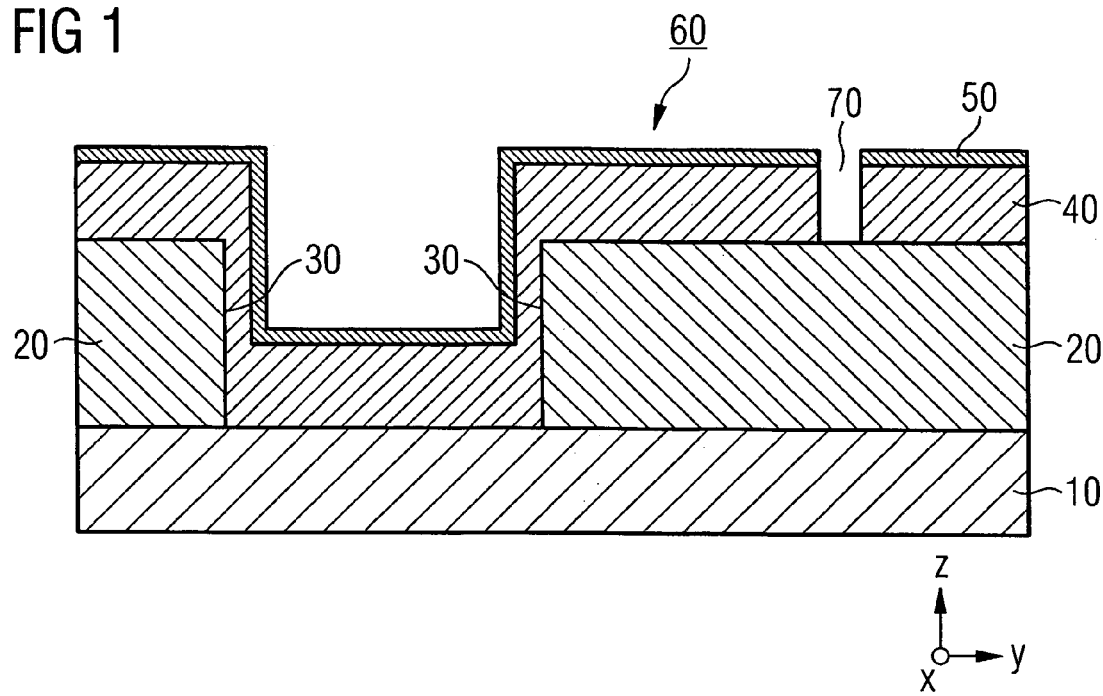
FIGS. 1 to 3 illustrate the problem underlying the invention and show a process for producing a mask in which the etching step according to the invention for uncovering side flanks of raised substrate structures is not used.

The following list of reference symbols can be used in conjunction with the figures:
10 Substrate
20 Raised structures
30 Side flanks
40 Carbon-containing first mask layer
50 Second mask layer
60 Mask
70 Opening hole
80 Trench
100 Residual surfaces
150 Side flank sections
170 Opening hole
300 Fissured carbon regions

DETAILED DESCRIPTION OF ILLUSTRATIVE EMBODIMENTS

FIG. 1 shows a substrate 10 on which two raised structures 20 are arranged. The raised structures 20 each have side flanks or side walls 30 which, by way of example, run perpendicular to the substrate 10. Alternatively, the side walls 30 may also run obliquely or at an angle of between 0 and 90° with respect to the substrate 10; the angle of inclination of the side walls or side flanks 30 is of no importance.

A first carbon-containing mask layer 40 is arranged on the substrate 10 and on the two raised structures 20 and has been provided with a second mask layer 50, for example an SiON layer.

It can be seen from FIG. 1 that the mask 60 formed from the two mask layers 40 and 50 on the substrate 10 has already been patterned and has an opening hole 70. This opening hole 70 was produced in a patterning step using a photoresist mask that is not illustrated in FIG. 1 since it was carried out beforehand. The mask 60 or the two mask layers 40 and 50 can be patterned in the usual way. By way of example, reference is made in this respect to the documents mentioned in the introduction relating to the patterning of carbon-containing mask layers.

In a further process step, the raised structure 20 is subjected, in the region of the opening hole 70, to an etching step that penetrates through the raised structure 20 so as to form a contact hole or trench 80. The upper mask layer 50 is also removed during this highly anisotropic contact hole etch.

Figure 2:
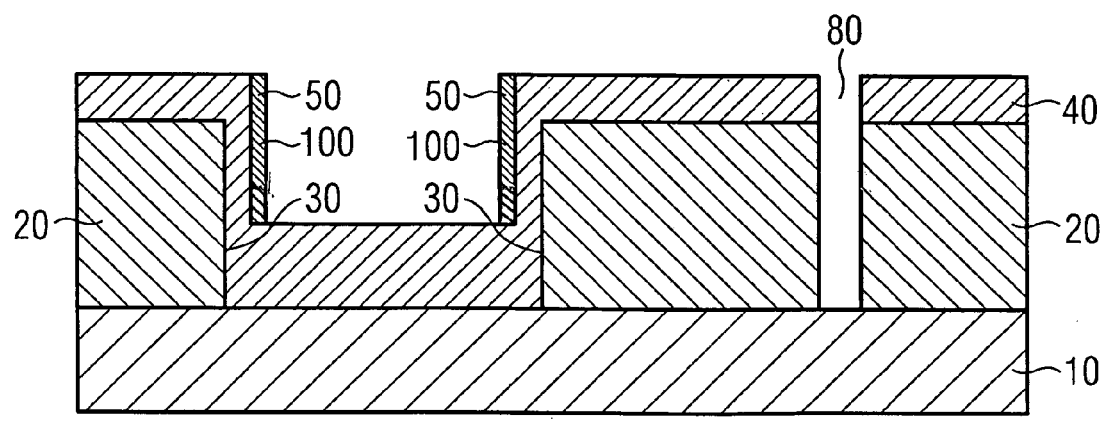

FIG. 2 shows the result of these process steps. It can be seen that the upper mask layer 50 has not been completely removed, since the etchant used to remove the upper mask layer 50 has a highly directional action and, therefore, etches substantially exclusively perpendicular to the surface of the substrate 10 (in the opposite direction to the "z direction"). By contrast, the second mask layer 50 is not etched in or opposite to the "y direction" or "x direction"—i.e., parallel to the substrate surface or perpendicular to the side flanks 30 of the raised structures 20—so that residual surfaces 100 of the upper mask layer 50 remain behind on the side flanks 30. This is shown in detail in FIG. 2.

Figure 3:
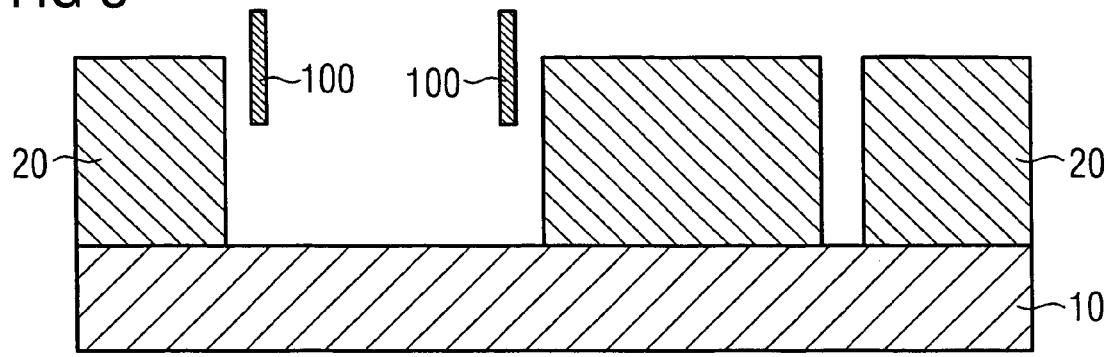

If, in a subsequent etching step, shown in FIG. 3, the carbon-containing first mask layer 40 is then removed, the residual surfaces 100 of the second mask layer 50 are likewise "lifted off"; the residual surfaces 100 of the second mask layer 50, therefore, flake off in an undesired or uncontrolled way and remain on the substrate 10. This flaking off of the second mask layer 50 can lead to the substrate 10 becoming impure or contaminated, since the material of the second mask layer 50 is now resting directly "loosely" on the substrate 10.

An exemplary embodiment of the process according to the invention, in which mask material of the second mask layer 50 is prevented from flaking off during removal of the first mask layer 40, will now be presented in connection with FIGS. 4 to 8.

Figure 4:
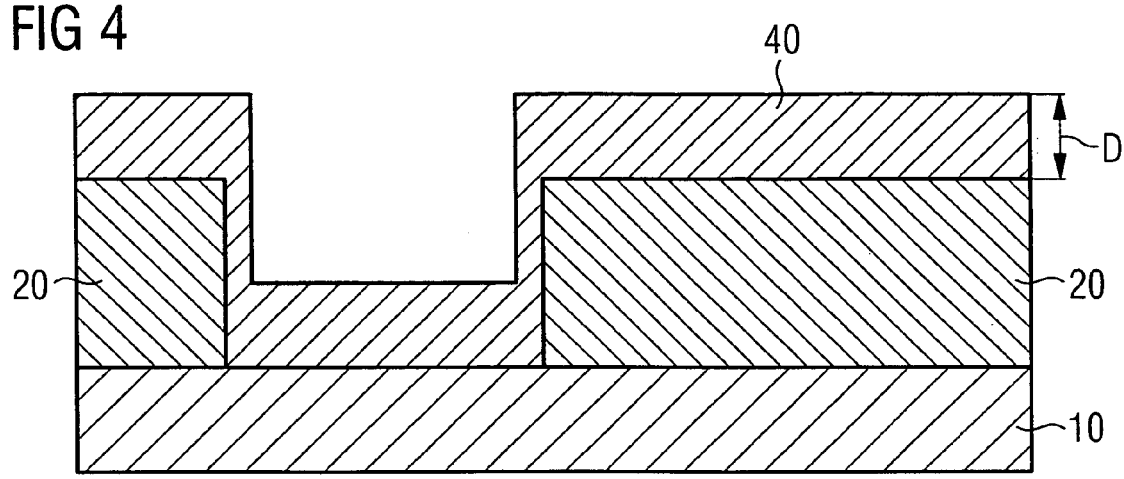

FIG. 4 shows a substrate 10 on which two raised structures 20 are arranged. A first mask layer 40, which contains carbon, is to be found on the substrate 10 and on the two raised structures 20.

The production of the structure shown in FIG. 4 thus far does not differ from the process described in connection with FIGS. 1 to 3. Unlike in the process described in connection with FIGS. 1 to 3, however, in the process described below the carbon-containing mask layer 40 is removed from the side flanks 30 of the two raised structures 20, so as to form uncovered side flank sections 150.

The uncovering of the side flanks 30 of the raised structures 20 takes place in an additional etching step to which the carbon-containing mask layer 40 is exposed. This etching step is preferably an anisotropic etching step in which the etching rate in the direction parallel to the substrate surface, i.e., in the "x" and/or "y" direction, is greater than perpendicular to the substrate surface, "z direction". This anisotropic form of the etching step ensures that the thickness D of the carbon-containing layer 40 outside the side flank region 30 is scarcely altered by the etching step. The resulting thickness D' outside the side flank region 30 is, therefore, approximately equal to the thickness D of the unetched carbon-containing mask layer 40, i.e.:

$$D \approx D'$$

Figure 5:
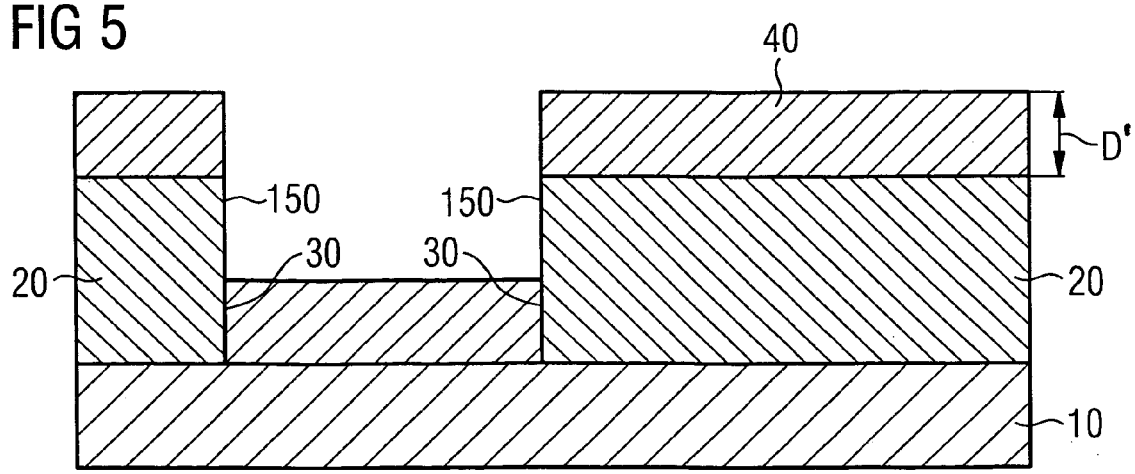

The uncovered side flanks 30 or the associated side flank sections 150 can be seen in detail in FIG. 5.

FIG. 6 shows the substrate 10 after a second mask layer 50, for example an SiON layer, has been applied to the first carbon-containing mask layer 40 and patterned to form an opening 170.

FIG. 7 illustrates the resulting structure after an etching step into the carbon-containing mask layer 40 has been carried out through the opening 170 in the upper mask 50 and the opening hole 70, which has already been shown in connection with FIG. 1 has been formed in the two mask layers 40 and 50. The structure of FIG. 7, therefore, corresponds to the structure shown in FIG. 1, except that in the region of the side flank sections 150 the upper mask layer 50 is resting directly on the side flanks 30. By contrast, in the structure shown in FIG. 2 the upper mask layer 50 is separated from the side flanks 30 by the lower carbon-containing mask layer 40.

Then, the raised structure 20 is etched in the region of the opening hole 70, with the upper mask layer 50 being removed at the same time. This is followed by removal of the carbon-containing mask layer 40.

FIG. 8 shows the resulting structure. It can be seen that in the region of the side flank sections 150 the mask material of the upper etching mask 50 remains on the resulting structure, since the material of the first mask layer 50 rests directly on the raised structure 20. Consequently, this mask material cannot be detached or "lifted off" during etching away or removal of the carbon-containing first mask layer 40. This prevents the first mask layer 50 from undesirably flaking off and, therefore, also prevents the first mask material 50 from "resting" loosely on the substrate 10. As a result, the substrate 10 is not soiled or uncontrollably contaminated with material of the first mask layer 50.

Figure 9:
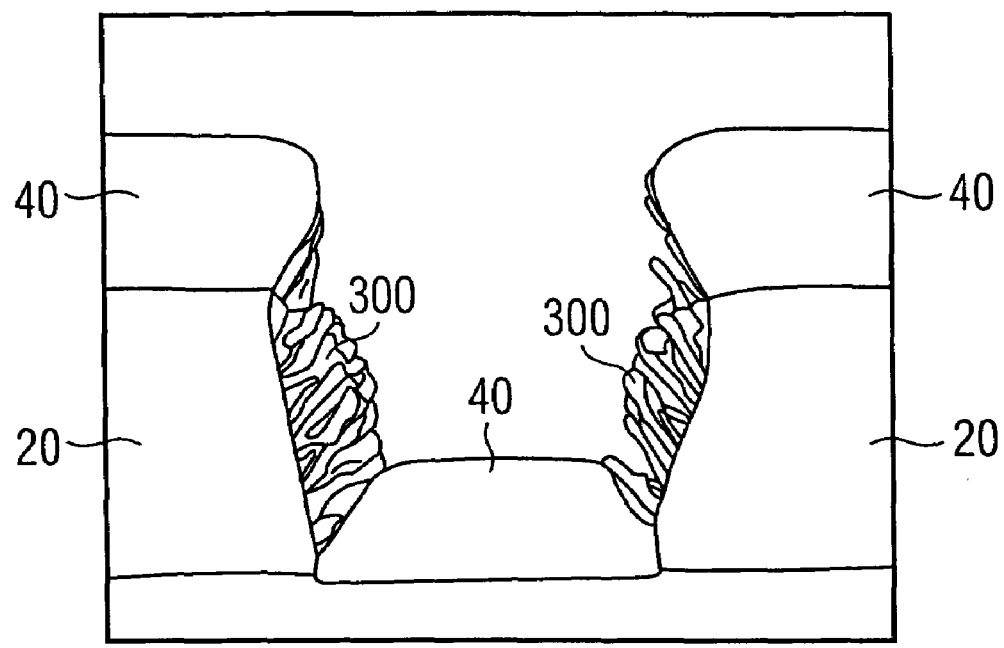
FIGS. 9 and 10 show examples for comparison purposes of sectional illustrations through structures that have been produced by the process illustrated in FIGS. 1 to 3 and by the process illustrated in FIGS. 4 to 8.
Figure 10:
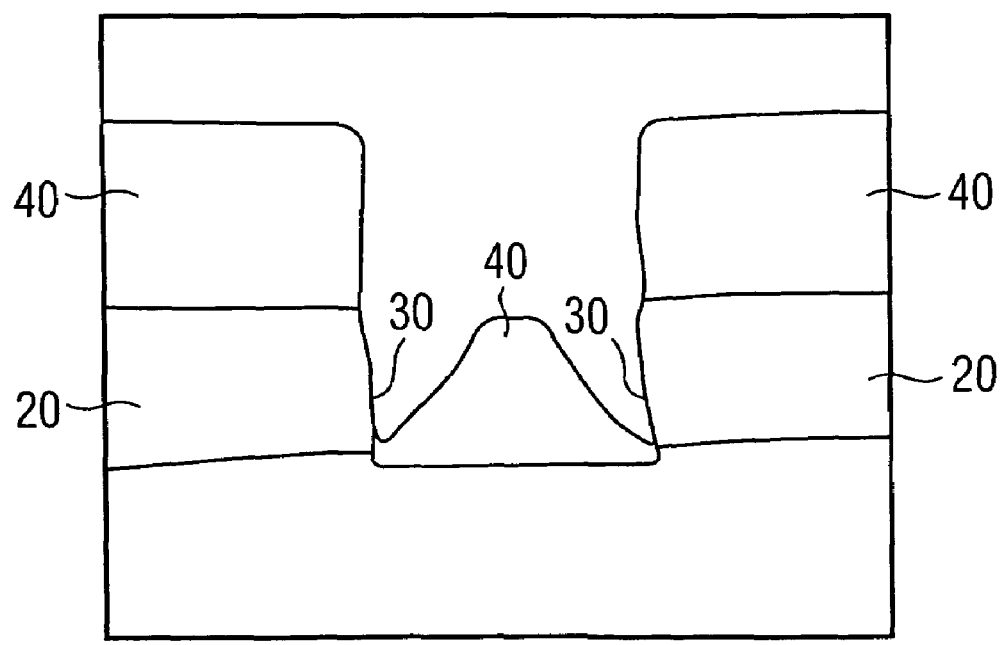

FIGS. 9 and 10 show sectional illustrations of structures that are formed in the process in accordance with FIGS. 1 to 3 and the process in accordance with FIGS. 4 to 8, respectively.

It can be seen from FIG. 9 that the side walls of the structures 20, consisting, for example, of silicon oxide (e.g. BPSG), are covered with the carbon-containing mask 40, which leads to the problems shown in FIGS. 1 to 3 during further processing. An additional difficulty for the further process sequence is the fact that the side walls are not covered with a continuous carbon-containing layer 40, but rather are extremely fissured (cf. reference number 300).

By contrast, FIG. 10 shows a structure produced using the process illustrated in FIGS. 4 to 8. It can be seen that in the region of the side flanks 30 of the raised structures 20, the carbon-containing mask layer 40 has been removed laterally, and the mask layer 50, which is subsequently to be deposited (cf. for example FIG. 6), will adhere directly to the structure 20.

What is claimed is:

1. A method for producing a mask on a substrate that has at least one raised structure, the method comprising:
   forming a first mask layer over the substrate;
   during or after the formation of the first mask layer, exposing the first mask layer to an etching step, the etching step being carried out in such a manner that material of the first mask layer that has been deposited on side flanks of the at least one raised structure is removed from the side flanks, such that a thickness of the first mask layer outside the side flank region is not substantially altered by the etching step;
   forming a second mask layer over the first mask layer and the uncovered side flank sections of the at least one raised structure; and
   patterning the first and second mask layers so as to complete the mask.

2. A method for producing a mask on a substrate that has at least one raised structure, the method comprising:
   forming a first mask layer over the substrate, wherein forming a first mask layer comprises forming a carbon-containing layer;
   during or after the formation of the first mask layer, exposing the first mask layer to an etching step, the etching step being carried out in such a manner that material of the first mask layer that has been deposited on side flanks of the at least one raised structure is removed from the side flanks;
   forming a second mask layer over the first mask layer and the uncovered side flank sections of the at least one raised structure; and
   pattern the first and second mask layers so as to complete the mask.

3. The method according to claim 1, wherein the etching step comprises an anisotropic etching step, in which the etching rate in the direction parallel to the substrate surface of the substrate is greater than perpendicular to the substrate surface of the substrate.

4. The method according to claim 1, wherein forming a second mask layer comprises depositing an $SiO_x$ or SiON material.

5. The method according to claim 1, wherein the etching step is carried out using an $H_2$-containing plasma.

6. The method according to claim 5, wherein the etching step is carried out using at least one of the following parameters:
   gas flow rate: 100 to 10 000 sccm,
   pressure: 2 to 8 Torr,
   power: 100 to 3000 watts,
   electrode spacing: 250 to 600 mils.

7. The method according to claim 1, wherein the etching step is carried out using an $O_2$-containing plasma.

8. The method according to claim 7, wherein the etching step is carried out using at least one of the following parameters:
   gas flow rate: 100 to 10 000 sccm of $O_2$,
   pressure: 2 to 8 Torr,
   power: 100 to 3000 watts,
   electrode spacing: 250 to 600 mils.

9. The method according to claim 1, wherein the etching step is carried out using an $NH_3$-containing plasma.

10. The method according to claim 9, wherein the etching step is carried out using at least one of the following parameters:
    gas flow rate: 100 to 10 000 sccm of $NH_3$,
    pressure: 2 to 8 Torr,
    power: 100 to 2000 watts,
    electrode spacing: 250 to 600 mils.

11. The method according to claim 1, wherein the etching step is carried out using an $N_2O$-containing plasma.

12. The method according to claim 11, wherein the etching step is carried out using at least one of the following parameters:
    gas flow rate: 100 to 10 000 sccm of $N_2O$,
    pressure: 2 to 8 Torr,
    power: 50 to 3000 watts,
    electrode spacing: 250 to 600 mils.

13. A method for producing mask on a substrate that has at least one raised structure, the method comprising:
    forming a first mask layer over the substrate;
    during or after the formation of the first mask layer, exposing the first mask layer to an etching step, the etching step being carried out in such a manner that material of the first mask layer that has been deposited on side flanks of the at least one raised structure is removed from the side flanks, wherein the material of the first mask layer that has been deposited on the side flanks of the at least one raised structure is completely removed from the side flanks;

forming a second mask layer over the first mask layer and the uncovered side flank sections of the at least one raised structure; and patterning the first and second mask layers so as to complete the mask.

14. The method according to claim 1, wherein the material of the first mask layer that has been deposited on the side flanks of the at least one raised structure is removed from portions of the side flanks.

15. A method of making a semiconductor device, the method comprising:

providing a workpiece that includes a raised structure disposed thereon, the raised structure having side flanks;

forming a first mask layer over the semiconductor body, the first mask layer comprising a carbon containing layer;

removing portions of the first mask layer overlying the side flanks of the raised structure;

forming a second mask layer over the side flanks of the raised structure and over remaining portions of the first mask layer;

patterning the first mask layer and the second mask layer to expose portions of the workpiece; and etching the exposed portions of the workpieee using at least the first mask layer as a mask.

16. The method of claim 15, wherein forming a second mask layer comprises forming a $SiO_x$ or SiON material.

17. The method of claim 15, wherein removing portions of the first layer comprises etching using an $H_2$-containing plasma.

18. The method of claim 15, wherein removing portions of the first layer comprises etching using an $O_2$-containing plasma.

19. The method of claim 15, wherein removing portions of the first layer comprises etching using an $NH_3$-containing plasma.

20. The method of claim 15, wherein removing portions of the first layer comprises etching using an $N_2O$-containing plasma.

* * * * *